United States Patent [19]

Elnashar et al.

[11] Patent Number: 5,289,060
[45] Date of Patent: Feb. 22, 1994

[54] PROGRAMMABLE GLITCH FILTER

[75] Inventors: Khodor S. Elnashar, Richardson; Jay T. Cantrell, Dallas; Clarence D. Lewis, Richardson, all of Tex.

[73] Assignee: Texas Instruments Incorporated, Dallas, Tex.

[21] Appl. No.: 945,546

[22] Filed: Sep. 16, 1992

[51] Int. Cl.⁵ ............................................. H03B 5/02
[52] U.S. Cl. ...................................... 307/520; 307/518; 307/603; 328/111
[58] Field of Search ............... 307/234, 518, 603, 606; 328/111

[56] References Cited

U.S. PATENT DOCUMENTS

| | | | |
|---|---|---|---|
| 4,398,105 | 8/1983 | Keller | 307/518 |
| 4,489,279 | 12/1984 | Kuroki | 307/526 |
| 4,497,068 | 1/1985 | Fischer | 307/234 |
| 4,527,075 | 7/1985 | Zbinden | 307/234 |
| 4,591,744 | 5/1986 | Koike | 307/518 |
| 4,694,200 | 9/1987 | Hetyei | 307/234 |
| 4,716,318 | 12/1987 | Koike | 328/111 |
| 4,717,835 | 1/1988 | Takeuchi | 307/603 |
| 4,812,771 | 3/1989 | Lauper et al. | 307/518 |
| 4,857,760 | 8/1989 | Stuebing | 307/234 |
| 5,001,374 | 3/1991 | Chang | 307/234 |
| 5,136,260 | 8/1992 | Yousefi-Elezei | 307/603 |

FOREIGN PATENT DOCUMENTS

14622  1/1983  Japan ................................. 307/603

*Primary Examiner*—John T. Kwon
*Attorney, Agent, or Firm*—Thomas G. Eschweiler; James C. Kesterson; Richard L. Donaldson

[57] ABSTRACT

A glitch filter identifies and eliminates positive edge and negative edge glitches without utilizing a high frequency sampling clock. The glitch filter comprises a programmable delay buffer string, two multiple input AND gates and a latch. The buffer string provides a plurality of incrementally delayed signals and utilizes them as signal samples thus simulating a high frequency sampling clock. The two multiple input AND gates serve to eliminate positive or negative edge glitches. The latch outputs the accurate filtered data without any positive or negative edge glitches.

11 Claims, 6 Drawing Sheets

Fig. 1

PRIOR ART

PROGRAMMABLE GLITCH FILTER

FIELD OF THE INVENTION

The invention is in the field of electronic circuits and particularly relates to asynchronous edge detection.

BACKGROUND OF THE INVENTION

Figure 1:
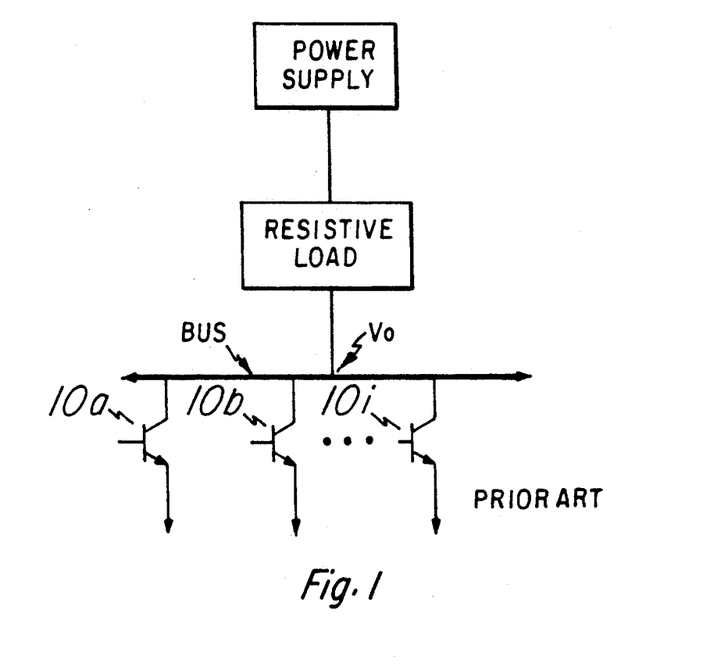
FIG. 1 is a circuit illustrating a configuration that leads to a "wired OR" phenomena.

In bus application circuits a common problem exists called the "wired OR phenomena". This phenomena may become evident when a plurality of pull-down transistors 10a–10i are configured in parallel with each other as seen in FIG. 1. When one or more transistors 10a–i stop conducting, the remainder of the transistors in the parallel path must conduct the total current. During the brief period of time when the current is being redistributed through the remaining conducting transistors, the node voltage, $V_0$, may glitch high. The magnitude of the glitch is proportional to the percentage of pull-down transistors 10a–i that discontinue conduction.

After redistribution of current in remaining conducting pulldown transistors 10a–i, the positive edge glitch goes away and the proper node voltage, $V_0$, is established. The "wired OR" phenomena may cause an error in logic operation if, during sampling, the glitch causes internal logic to change states.

Checking for "wired OR" type glitches often requires clocks with frequencies as high as several hundred megahertz to assure that all glitches are identified and eliminated. Providing a high frequency clock requires another clock circuit to be designed and built thus increasing die area on a semiconductor chip or requires another discrete clock (such as a crystal oscillator) to be put on the circuit board which increases system cost and increases board complexity. Further, the existence of a high frequency clock has detrimental effects on performance of the semiconductor chip by increasing the chip's power dissipation. In CMOS integrated circuits (which are overwhelmingly used in digital integrated circuit applications) power dissipation is directly proportional to frequency of operation. Therefore, the high frequency circuitry, whether internal or external to the semiconductor die, increases the chip power dissipation which often is a critical design constraint and therefore unacceptable.

It is an object of this invention to provide a digital glitch filter that identifies and eliminates high frequency glitches without the addition of a high frequency sampling clock.

It is another object of this invention to provide a programmable glitch filter so that a user may manually dictate the specific duration of the sampling window desired to filter glitches.

Other objects and advantages of the invention will become apparent to those of ordinary skill in the art having reference to the following specification together with the drawings herein.

SUMMARY

A glitch filter identifies and eliminates positive edge and negative edge glitches without utilizing a high frequency sampling clock. The glitch filter comprises a programmable delay buffer string, two multiple input AND gates and a latch. The buffer string provides a plurality of incrementally delayed signals and utilizes them as data signal samples thus simulating a high frequency sampling clock. The two multiple input AND gates serve to eliminate positive or negative edge glitches. The latch outputs the accurate filtered data without any positive or negative edge glitches.

DETAILED DESCRIPTION OF THE PREFERRED EMBODIMENT

Figure 2:
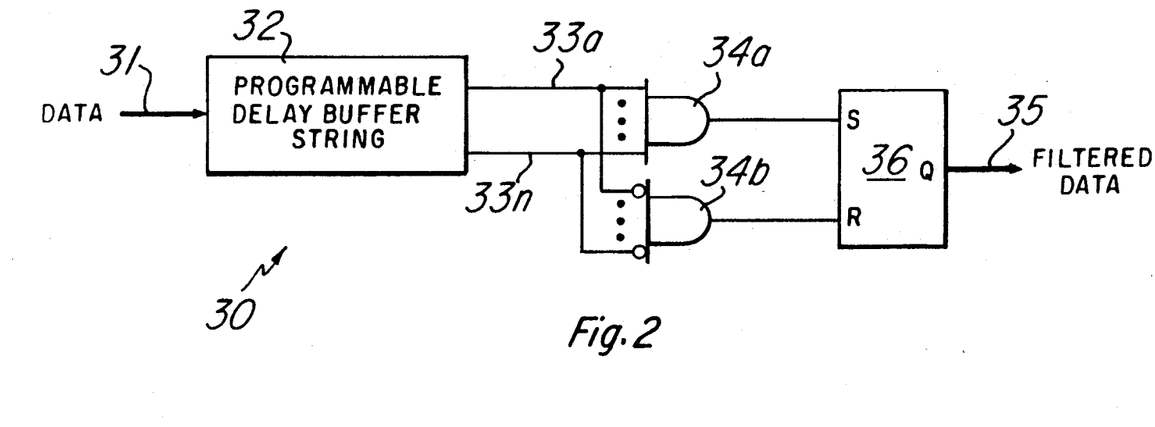
FIG. 2 is a block diagram illustrating the preferred embodiment of the invention.

FIG. 2 is a block diagram illustrating the preferred embodiment of the invention. A glitch filter 30 includes a programmable delay buffer string 32 which takes a data input signal 31 and outputs a plurality of signals 33a–n each incrementally delayed from data input signal 31. Programmable delay buffer 32 may be externally manipulated to control the magnitude of the incremental delay between signals 33a–n. Signals 33a–n are coupled both to a multiple input AND gate 34a and a multiple inverted input AND gate 34b. AND gate 34a output becomes a SET (S) input to an SR latch 36. AND gate 34b output becomes a RESET (R) input to latch 36. The output of latch 36 represents data signal 31 sampled such that any potential glitches, either positive edge and negative edge, are eliminated. Glitch filter 30 may consist of separate discrete components or may be integrated onto a single semiconductor chip.

Figure 3:
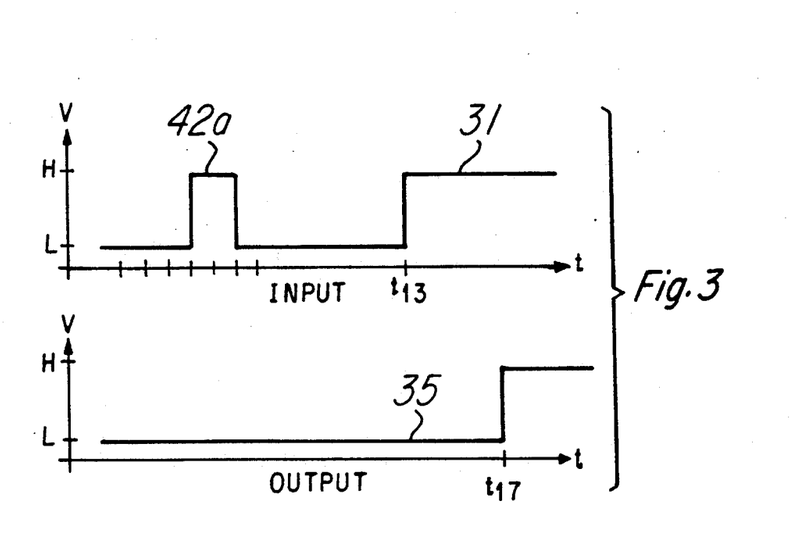
FIG. 3 is a timing diagram illustrating an instance when a glitch filter needs to identify a positive edge glitch.
Figure 3A:
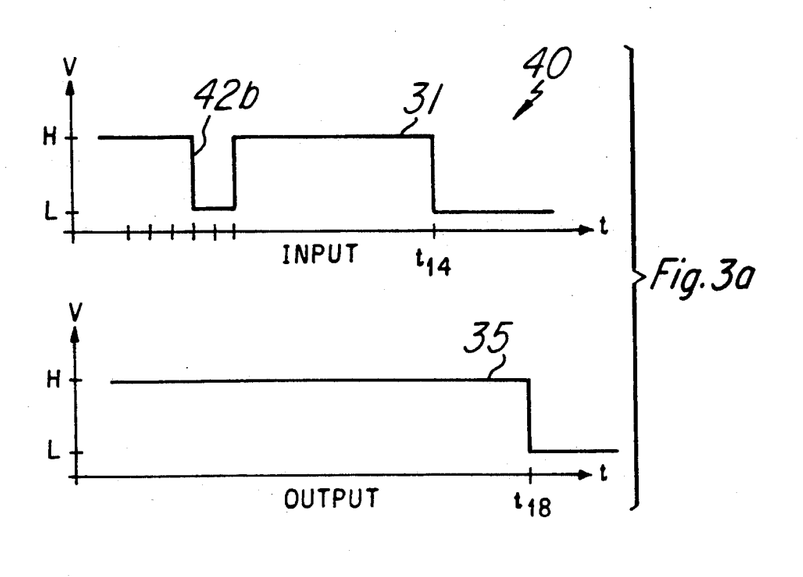
FIG. 3a is a timing diagram illustrating an instance when a glitch filter needs to identify a negative edge glitch.

FIG. 3 and FIG. 3a represent two possible glitch scenarios. FIG. 3 illustrates a positive edge glitch 42a occurring between $t_4$ and $t_6$. During this time any prior art sampling mechanism would register a high binary value incorrectly since a low binary value is the intended value. AND gate 34a of FIG. 2 eliminates positive edge glitches 42a. FIG. 3a illustrates a negative edge glitch 42b also occurring between $t_4$ and $t_6$. During this time any prior art sampling mechanism would register a low binary value incorrectly since a high binary value is the intended value. AND gate 34b of FIG. 2 eliminates negative edge glitches 42b. (A more detailed explanation of glitch filter's 30 advantageous operation follows later.)

Figure 4:
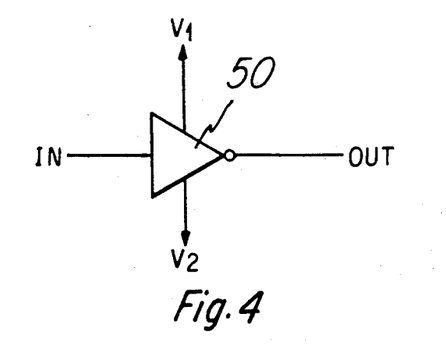
FIG. 4 is a block diagram illustrating an invertor element used in a programmable delay buffer string.
Figure 4A:
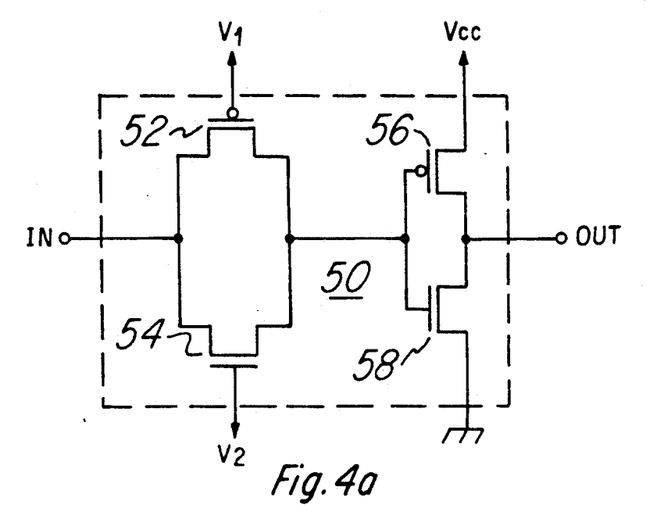
FIG. 4a is a circuit diagram illustrating the invertor element of FIG. 4.

FIG. 4 is a block diagram illustrating an invertor element 50 within programmable delay buffer string 32 of FIG. 2. Buffer string 32 may comprise a plurality of invertors 50 coupled together in series. FIG. 4a is a circuit diagram illustrating invertor element 50 in greater detail. Invertor 50 has a CMOS transmission gate 51, composed of a PMOS transistor 52 and an NMOS transistor 54 connected in parallel, and a CMOS invertor 53, composed of a PMOS transistor 56 and an NMOS transistor 58 connected in series. The coupling of a plurality of invertors 50 in series forms the programmable delay buffer string 32.

A detailed functional description of the invention now follows with reference to FIGS. 3-4a. In FIG. 2, programmable delay buffer string 32, composed of a plurality of invertor elements 50 connected in series, takes data signal 31 and provides a plurality of incrementally delayed signals 33a-n. The delay between each delayed signal 33a-n is a function of variable analog voltage sources V1 and V2 of FIG. 4 and FIG. 4a.

Referring to FIG. 4 and FIG. 4a, variable voltage sources V1 and V2 may operate independently of one another. In FIG. 4a, the CMOS transmission gate 51, composed of transistors 52 and 54, acts as a variable resistor through the manipulation of variable voltage sources V1 and V2 which are coupled to the gates of transistors 52 and 54 respectively. The CMOS invertor 53, composed of transistors 56 and 58, provides a substantially constant capacitance (associated with the gate-to-source capacitance of NMOS transistor 58). Therefore, invertor element 50 provides a variable "RC" time constant which is programmable via variable analog voltage sources V1 and V2. The variable "RC" time constant allows the signal delay through invertor 50 (and consequentially through programmable delay buffer string 32) to be alterable. In this embodiment, the nominal delay within two invertors coupled in series (a buffer) is approximately 2.5 nS (nanoseconds). This delay may be tightly controlled by measuring it and adjusting V1 and V2 appropriately. Therefore, a plurality of incrementally delayed signals 33a-n, each incrementally delayed by 2.5nS, become inputs to AND gates 34a and 34b. As earlier stated, AND gate 34a addresses the potential glitch problem shown in FIG. 3.

A positive edge glitch occurs between $t_4$ and $t_6$ in FIG. 3. Each time increment, $t_n$, represents a 2.5 nS delay corresponding to outputs signals 33a-n of FIG. 2. Therefore, signals 33a-n are a binary string of "1's" and "0's" being AND gate 34a. If all signals 33a-n are not a "1" concurrently (which would represent a high binary signal), then the output of AND gate 34a will be a "0" which represents the desired binary value before $t_{17}$. Therefore AND gate AND 34a effectively filters out positive edge glitches 42a. The output of AND gate 34a (presently a "0") is input to latch 36 and becomes latched onto the output of latch 36, thus representing the intended data signal without positive edge glitch 42a.

Similarly, AND gate 34b of FIG. 2 provides the elimination of negative edge glitches 42b shown in FIG. 3a. In FIG. 3a, a negative glitch 42b occurs between $t_4$ and $t_6$. Signals 33a-n are a binary string of "1's" and "0's" that represent data signal 31. If all signals 33a-n are not a "0", then the output of AND gate 34b will be a "0" which then forms the RESET input of latch 36. A "0" on the RESET latch input indicates that the data latched previously should remain on the latch output. Since a "1", according to FIG. 3a, would have been on latch 36 output, the output of latch 36 will remain a "1", which is the desired value, until $t_{18}$ when signal 35 goes low. Note the delay in FIGS. 3 and 3a between the signal transition of input signal 31 and output signal 35. This time delay is due primarily to the accumulation of propagation delays through each incremental delay element. Therefore, AND gate 34b effectively filters out negative edge glitches 42b.

Glitch filter 30 of FIG. 2 advantageously uses programmable delay buffer string 32 to effectively sample data signal 31. As stated earlier, programmable delay buffer string 32 provides a plurality of incrementally delayed signals 33a-n, delayed from one another 2.5 nS. Signals 33a-n acts as a sampling signal, sampling data signal 31 every 2.5 nS and inputting to AND gates 34a and 34b. Inputs to AND gates 34a and 34b, signals 33a-n, represent the status of data signal 31 at numerous times (for example $t_1$, $T_2$, etc.). For example 33a, may represent the status of data signal 31 at $t_1$ and 33b may represent the status of data signal 31 at $t_2$, etc (see FIG. 3 and FIG. 3a). Therefore, programmable delay buffer string 32 acts as an equivalent 400 megahertz sampling clock without the disadvantages of using high frequency clock circuitry. More, generally, using signal delay elements to act as a sample clock allows a designer to utilize any desired sampling frequency simply by cascading delay elements together. Further, by use of programmable signal delay buffers 50, a designer can finely tune the sampling frequency by manipulating variable analog voltage sources V1 and V2 to increase or decrease signal transmission through buffers 50. This allows high frequency sampling without the high frequency clock disadvantage of increased power dissipation.

Figure 5:
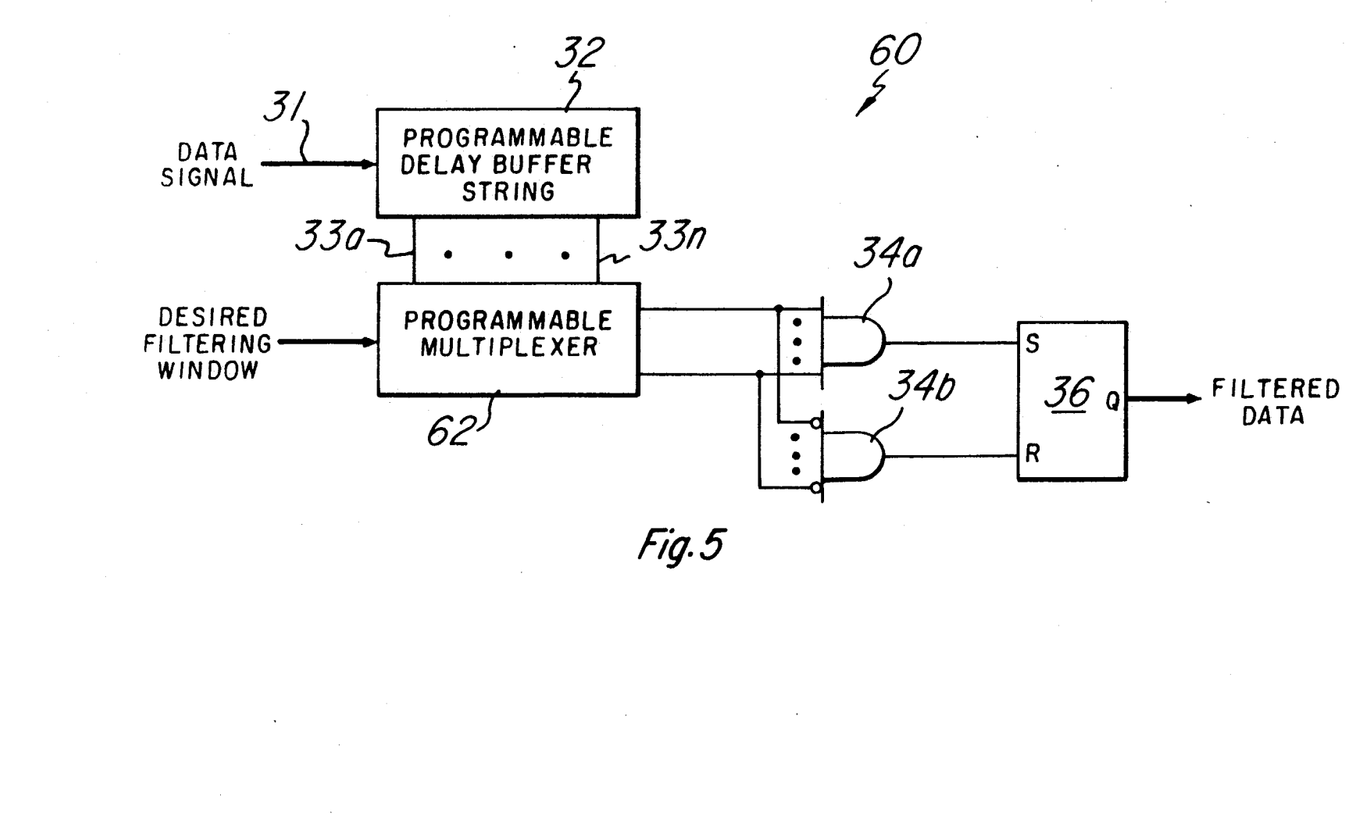
FIG. 5 is a block diagram illustrating an alternative embodiment of the invention.

FIG. 5 is a block diagram illustrating an alternative embodiment of the invention. FIG. 5 includes a programmable multiplexer 62 coupled between programmable delay buffer string 32 and latch 36. Multiplexer 62 provides an additional feature of allowing the user to decide the width (in time) of the sampling window desired to look for glitches. This gives the user additional flexibility and allows glitch filter 60 to become applicable in a greater number of systems that require different performance specifications.

Figure 6:
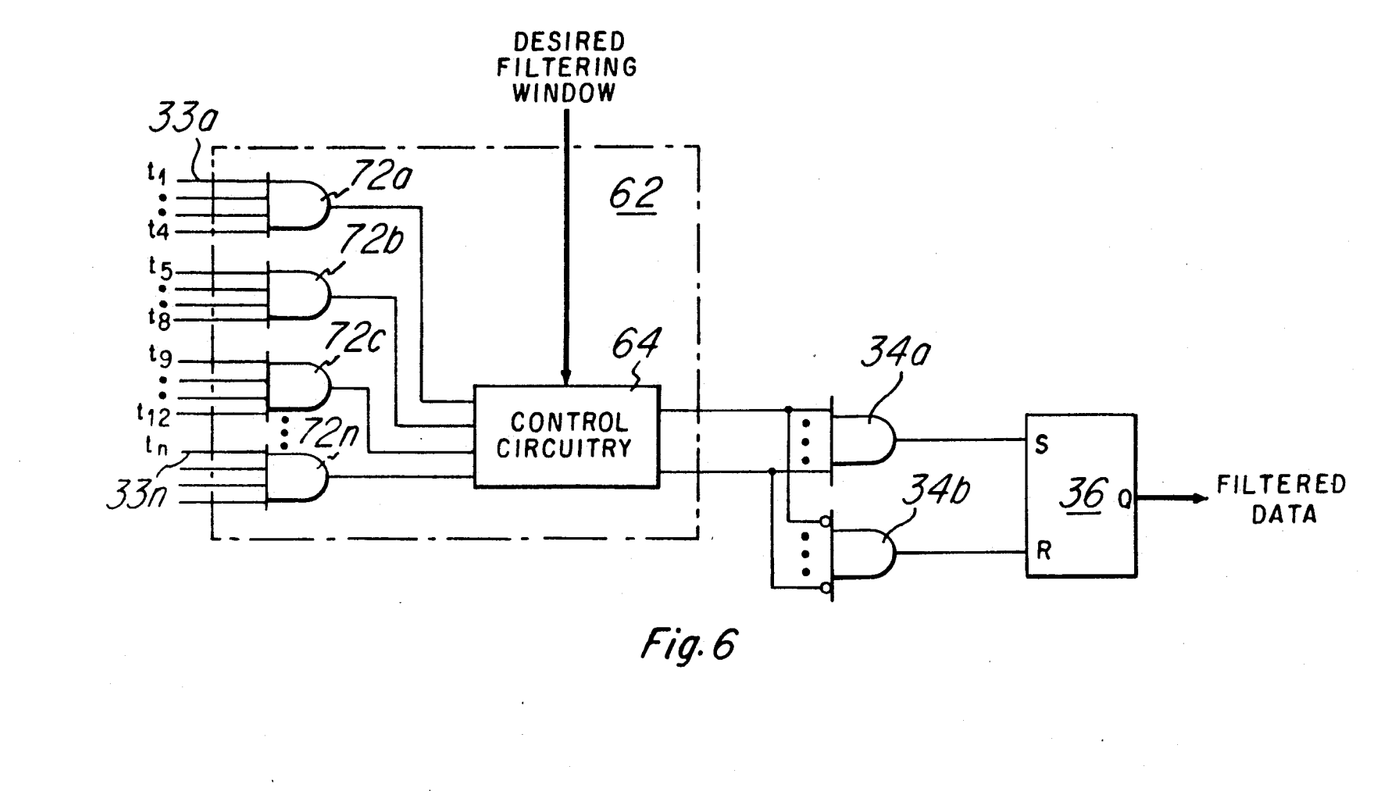
FIG. 6 is a gate level diagram illustrating a programmable multiplexer used in the alternative embodiment of the invention.

FIG. 6 is a gate level diagram illustrating the details of programmable multiplexer 62. Incrementally delayed signals 33a-n, from delay buffer string 32, enter a plurality of multiple input AND gates 72a-n. The output of AND gates 72a-n are coupled to a control circuit 64 and are multiplexed dependent upon external specifications determined by the user through software. Control circuitry 64 outputs, according to software, a plurality of signals coupled to multiple AND gates 34a and 34b which in turn are coupled to sample latch 36.

FIG. 5 is a block level diagram illustrating an alternative embodiment of the invention. In this embodiment, programmable delay buffer string 32 is connected to a programmable multiplexer 62 which is also connected to SR sampling latch 36. Multiplexer 62 allows the system user to specify the sampling window he/she wishes to have examined for potential glitches. In other words, if a user wishes to sample for a glitch only during time $t_4$-$t_8$ it may be accomplished. This provides system flexibility by allowing the use to define when to look for glitches 42a and 42b and for how long the circuitry should look for glitches 42a and 42b. FIG. 6 shows multiplexer 62 in more detail.

FIG. 6 is a block diagram illustrating the preferred embodiment of multiplexer 62. Signals 33a-n output from programmable delay buffer string 32 and enter a plurality of multiple input AND gates 72a-n. In this embodiment, each AND gate 72a-n has four inputs, however, the number of inputs to each AND gate 72a-n can be varied in the design of multiplexer 62, thus providing varying control resolution. The outputs of AND gates 72a-n are connected to control circuitry 64 which knows, via software, what is the desired sampling window. Control circuitry 64 allows specific signals 72a-n, specified by the user via software, to pass through transparently to multiple input AND gates 34a and 34b while forcing remaining signals to a high binary value and outputting them to multiple input AND gates 34a and 34b. Therefore, signals outside the sampling window specified by the user are virtually ignored since a high binary value as an AND gate input serves only to enable the AND gate. Therefore, only the signals in the time frame within the sampling window specified by the user screen for potential glitches. As in the system of FIG. 2, both positive edge glitches 42a and negative edge glitches 42b may be identified and removed using programmable multiplexer 62. In the alternative embodiment multiple input AND gates 34a and 34b are shown within multiplexer 62, however, they could easily reside outside multiplexer 62 and operate as separate components. Multiplexer 62 is called programmable because the user, through software, may control the size of the sampling window.

Although the invention has been described with reference to the preferred embodiment herein, this description is not to be construed in a limiting sense. Various modifications of the disclosed embodiment will become apparent to persons skilled in the art upon reference to the description of the invention. It is therefore contemplated that the appended claims will cover any such modifications or embodiments as fall within the true scope of the invention.

What is claimed is:

1. A glitch filter for a singal, comprising:
   a delay circuit, having an input coupled to the signal, and having a plurality of outputs wherein the delay circuit comprises:
     a plurality of programmable delay buffers each with an input and an output connected together in series such that they form a string, wherein the signal is connected to the input of the first delay buffer in the string and the output of each buffer in the string forms the plurality of outputs and wherein the plurality of outputs of the delay circuit provide an incrementally sampled signal without the use of a high frequency clock; and
   filtering means connected to the plurality of outputs of the delay circuit.

2. The glitch filter of claim 1 wherein the programmable delay buffer comprises two programmable delay invertors coupled together in series.

3. The glitch filter of claim 2 wherein the programmable delay invertor further comprises:
   a first variable voltage source;
   a second variable voltage source;
   a fixed voltage source;
   a first PMOS transistor with a gate connected to the first variable voltage source;
   first NMOS transistor with a source connected to a source of the PMOS transistor forming an input to the programmable delay invertor, a drain connected to a drain of the PMOS transistor, and a gate connected to the second variable voltage source;
   a second PMOS transistor with a source connected to the fixed voltage source and a gate connected to the drain of the first PMOS transistor;
   a second NMOS transistor with a source connected to circuit ground, a gate connected to the gate of the second PMOS transistor, and a drain connected to the drain of the second PMOS transistor forming an output to the programmable delay invertor.

4. The glitch filter of claim 3 wherein the first PMOS transistor coupled to the first variable voltage source and first NMOS transistor coupled to the second variable voltage source form a variable resistor and the second PMOS transistor and second NMOS transistor form an invertor having a variable "RC" time constant.

5. The glitch filter of claim 4 wherein the first and second variable voltage sources are analog voltage sources.

6. The glitch filter of claim 1 wherein the filtering means comprises:
   a multiple input AND gate connected to the plurality of outputs of the delay circuit for filtering out positive edge glitches;
   a multiple inverted input AND gate connected to the plurality of outputs of the delay circuit for filtering out negative edge glitches;
   a latch with a set input, a reset input, and an output, the set input connected to the output of the multiple input AND gate for setting the signal to the output of the latch, the reset input connected to the output of the multiple inverted input AND gate for resetting the output of the latch when it has a high binary value, and the output represents the filtered signal.

7. The glitch filter of claim 1 further comprising:
   a programmable multiplexer coupled between the delay circuit and the filtering means, for allowing a desired window of time to filter glitches on the signal to be selected.

8. The glitch filter of claim 7 wherein the programmable multiplexer comprises:
   a plurality of multiple input AND gates coupled to the plurality of outputs of the delay circuit; and
   a control circuit coupled to the output of the plurality of multiple input AND gates and to an external desired filtering window input wherein a user expresses the desired filtering window via software and the control circuit couples the signals associated with the desired filtering window to the filtering means and either forces the remaining signals from the delay circuit to a high binary value and couples them to the filtering means wherein the filtering means ignores high binary value signals for negative edge glitch elimination or forces the remaining signals from the delay circuit to a low binary value and couples them to the filtering means wherein the filtering means ignores low binary value signals for positive edge glitch elimination.

9. A method of filtering noise without the use of high frequency sampling circuitry, comprising the steps of:
   sending a signal through a plurality of programmable delay buffers coupled together in series, wherein an output of each buffer forms a plurality of incrementally delayed signals; and
   filtering the plurality of incrementally delayed signals by treating each incrementally delayed signal as an instantaneous digital signal wherein the plurality of incrementally delayed signals act as an equivalent high frequency sampling mechanism.

10. The method of claim 9 wherein noise may be filtered during a specific window of time, comprising the steps of:
   indicating the desired filtering window to a multiplier;

formulating a binary code in response to the desired filtering window indication; and sending the binary code from the multiplexer to a filtering means in response to the desired filtering window indication wherein the code communicates the specific time duration to perform filtering.

11. The method of claim 9 wherein the step of filtering the plurality of incrementally delayed signals further comprises the step of inputting the plurality of incrementally delayed signals into a multiple input AND gate wherein an output of the multiple input AND gate reflects the true value of the signal thereby eliminating the nose from the signal.

* * * * *